United States Patent
Kanaga et al.

(10) Patent No.: US 9,425,302 B2
(45) Date of Patent: Aug. 23, 2016

(54) SEMICONDUCTOR DEVICE

(71) Applicant: Panasonic Intellectual Property Management Co., Ltd., Osaka (JP)

(72) Inventors: Wataru Kanaga, Aichi (JP); Hiroaki Kawano, Osaka (JP); Shingo Matsuda, Kyoto (JP); Katsuhiko Kawashima, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/002,326

(22) Filed: Jan. 20, 2016

(65) Prior Publication Data

US 2016/0133739 A1  May 12, 2016

Related U.S. Application Data

(63) Continuation of application No. PCT/JP2014/003232, filed on Jun. 17, 2014.

(30) Foreign Application Priority Data

Jul. 25, 2013 (JP) ................................. 2013-154250

(51) Int. Cl.
   *H01L 23/48* (2006.01)
   *H01L 29/778* (2006.01)
   (Continued)

(52) U.S. Cl.
   CPC ...... *H01L 29/7787* (2013.01); *H01L 29/41766* (2013.01); *H01L 29/2003* (2013.01)

(58) Field of Classification Search
   CPC ............ H01L 29/2003; H01L 29/7787; H01L 29/41766
   See application file for complete search history.

(56) References Cited

U.S. PATENT DOCUMENTS 5,834,802 A    11/1998  Takahashi et al.
8,772,842 B2 *  7/2014  Dora ............................ 257/192
(Continued)

FOREIGN PATENT DOCUMENTS

JP    3-120902    5/1991
JP    9-115926    5/1997
(Continued)

OTHER PUBLICATIONS

International Search Report of PCT application No. PCT/JP2014/003232 dated Sep. 9, 2014.

*Primary Examiner* — Nicholas Tobergte
(74) *Attorney, Agent, or Firm* — McDermott Will & Emery LLP

(57) ABSTRACT

A semiconductor device includes a source electrode portion and a drain electrode formed on a semiconductor stacked body so as to be at an interval from each other, and a gate electrode formed between the source electrode portion and the drain electrode at an interval from the source electrode portion and the drain electrode. The source electrode portion includes a first recess electrode being directly in contact with a two-dimensional electron gas layer formed in the first nitride semiconductor layer, and a surface electrode formed between the gate electrode and the first recess electrode and connected conductively to the two-dimensional electron gas layer. A source potential is applied to the surface electrode and the recess electrode, and a width of the surface electrode in a gate-source direction is 0.4 times or more a distance between a gate-side end of the surface electrode and a source-side end of the gate electrode.

10 Claims, 7 Drawing Sheets

(51) Int. Cl.
*H01L 29/417* (2006.01)
*H01L 29/20* (2006.01)

(56) References Cited

U.S. PATENT DOCUMENTS

| | | | |
|---|---|---|---|
| 2010/0244043 A1 | 9/2010 | Khalil et al. | |
| 2011/0049526 A1* | 3/2011 | Chu | H01L 21/28587 257/76 |
| 2012/0223319 A1* | 9/2012 | Dora | H01L 29/2003 257/76 |
| 2012/0248500 A1 | 10/2012 | Kajitani | |
| 2013/0221409 A1 | 8/2013 | Nakajima et al. | |
| 2014/0264431 A1* | 9/2014 | Lal | H01L 27/0883 257/121 |

FOREIGN PATENT DOCUMENTS

| | | |
|---|---|---|
| JP | 9-199676 | 7/1997 |
| JP | 2010-539691 | 12/2010 |
| JP | 2011-129769 | 6/2011 |
| WO | 2012/013943 | 2/2012 |

* cited by examiner

SEMICONDUCTOR DEVICE

RELATED APPLICATIONS

This application is a Continuation of International Application No. PCT/JP2014/003232, filed on Jun. 17, 2014, which in turn claims priority from Japanese Patent Application No. 2013-154250, filed on Jul. 25, 2013, the contents of all of which are incorporated herein by reference in their entireties.

BACKGROUND

1. Field of the Invention

The present disclosure relates to a field effect transistor and more particularly, to a field effect transistor to be used in a high-frequency amplifier.

2. Description of the Related Art

A nitride semiconductor such as GaN or AlGaN is known as a material for a field effect transistor (FET). The field effect transistor made of the nitride semiconductor is widely used in a power amplifier at microwave band.

In order to obtain a power amplifier having high gain and high output power characteristics, it is important to enhance linearity of the field effect transistor.

As a technique to enhance the linearity of the field effect transistor, there is an example in which at least two transistors each having a different gate recess depth are used, as disclosed in Japanese Translation of PCT Publication No. 2010-539691.

SUMMARY

A semiconductor device in an aspect of the present disclosure includes a substrate, and a semiconductor stacked body including a first nitride semiconductor layer formed on the substrate, and a second nitride semiconductor layer formed on the first nitride semiconductor layer and having a wider bandgap than the first nitride semiconductor layer. The semiconductor device further includes a source electrode portion and a drain electrode formed at an interval from each other and above a lower surface of the semiconductor stacked body, and a gate electrode formed between the source electrode portion and the drain electrode at an interval from the source electrode portion and the drain electrode. The source electrode portion includes a first recess electrode being directly in contact with a two-dimensional electron gas layer formed in the first nitride semiconductor layer, and a surface electrode formed between the gate electrode and the first recess electrode so as to be directly in contact with an upper surface of the second nitride semiconductor layer, and connected conductively to the two-dimensional electron gas layer through the second nitride semiconductor layer. Furthermore, the surface electrode and the first recess electrode have potentials substantially equal to a source potential, and a width of the surface electrode in a gate-source direction is 0.4 times or more a distance between a gate-side end of the surface electrode and a source-side end of the gate electrode.

In this configuration, mutual conductance can moderately vary with respect to an increase in gate-source voltage.

In the semiconductor device in the aspect of the present disclosure, the source electrode portion preferably further includes a second recess electrode formed between the first recess electrode and the gate-side end of the surface electrode, and a bottom surface position of the second recess electrode is above a bottom surface position of the second nitride semiconductor layer. According to this preferable configuration, the second nitride semiconductor layer provided right under the second recess electrode can be reduced in thickness with some thickness remaining, so that resistance between the second recess electrode and the two-dimensional electron gas layer can be reduced, and a large current can flow from the two-dimensional electron gas layer to the second recess electrode. Therefore, the mutual conductance can further moderately vary with respect to the increase in gate-source voltage.

In the semiconductor device in the aspect of the present disclosure, at least a part of the second nitride semiconductor layer provided under the surface electrode is preferably formed of a third nitride semiconductor layer having a wider bandgap than the second nitride semiconductor layer. According to this preferable configuration, since the third nitride semiconductor layer provided under the surface electrode has the wider bandgap than the second nitride semiconductor layer, a carrier concentration of a two-dimensional electron gas layer is high, so that the gate-source resistance can be reduced. Therefore, the value of the mutual conductance can be increased, so that the mutual conductance can further moderately vary with respect to the increase in gate-source voltage.

In the semiconductor device in the aspect of the present disclosure, the second nitride semiconductor layer provided under the surface electrode preferably includes a first portion having a first thickness, and a second portion having a second thickness larger than the first thickness. According to this preferable configuration, since the thickness of the first portion is different from the thickness of the second portion in the second nitride semiconductor layer, a contribution amount to the mutual conductance can be different between the first portion and the second portion, so that the mutual conductance can further moderately vary with respect to the increase in gate-source voltage.

In the semiconductor device in the aspect of the present disclosure, a plurality of semiconductor devices each having a different width of the surface electrode in the gate-source direction are preferably connected in parallel. According to this preferable configuration, since there is a difference in width of the surface electrode in the gate-source direction, the semiconductor device has a plurality of mutual conductance values, so that the mutual conductance can further moderately vary with respect to the increase in gate-source voltage.

A semiconductor device in an aspect of the present disclosure includes a substrate, and a semiconductor stacked body including a first nitride semiconductor layer formed on the substrate, and a second nitride semiconductor layer formed on the first nitride semiconductor layer and having a wider bandgap than the first nitride semiconductor layer. The semiconductor device further includes a source electrode portion and a drain electrode formed above the semiconductor stacked body at an interval from each other, and a gate electrode formed between the source electrode portion and the drain electrode at an interval from the source electrode portion and the drain electrode. The source electrode portion includes a first recess electrode being directly in contact with a two-dimensional electron gas layer formed in the first nitride semiconductor layer, and a surface electrode formed between the gate electrode and the first recess electrode so as to be connected to the two-dimensional electron gas layer, and a source potential is applied to the surface electrode and the recess electrode. A plurality of the semiconductor devices each having a different width of the surface electrode in a gate-source direction are connected in parallel.

With this configuration, since the width of the surface electrode in the gate-source direction is different, the mutual conductance can moderately vary with respect to an increase in gate-source voltage in a vicinity of a gm maximum value.

According to the present disclosure, the mutual conductance can moderately vary with respect to the variation in gate-source voltage, so that a high-frequency amplifier having excellent linearity and capable of a high-output operation can be manufactured.

DESCRIPTION OF EMBODIMENTS

Figure 1:
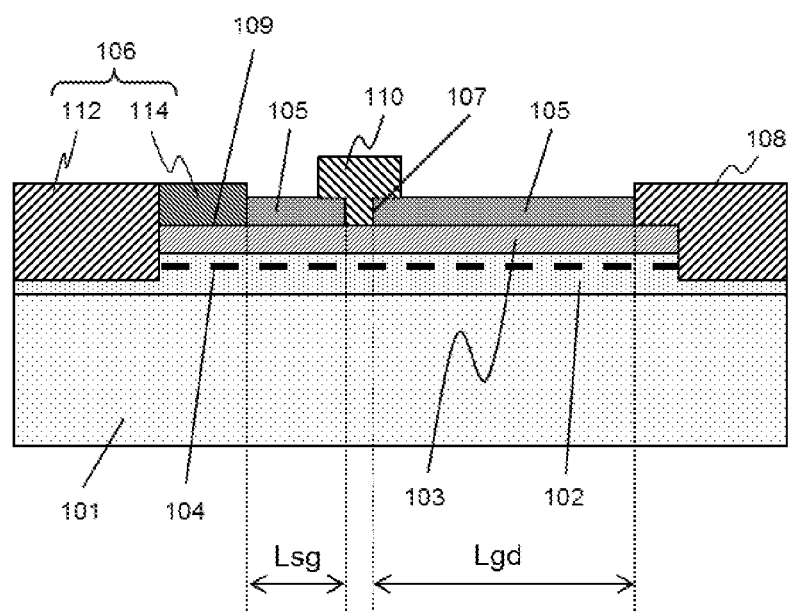
FIG. 1 is a cross-sectional view of a semiconductor device in a first exemplary embodiment.

In order to enhance linearity of a field effect transistor, it is important to provide flatness in a characteristic curve between gm (mutual conductance) and Vgs (a gate-source voltage).

Meanwhile, in a semiconductor device having the conventional gate recess structure, a flat gm-Vgs characteristic curve is provided by combining a plurality of transistors having different gate recess depths. However, the gate recess depth of each transistor fluctuates contrary to a design intent. This is because it is difficult to control an etching amount in an etching process to form a gate recess, so that it is difficult to uniformly form the gate recess with high reproducibility.

Here, as for a field effect transistor in which a carrier travel layer is composed of GaN, a barrier layer is composed of AlGaN, and a gate electrode is directly formed on the barrier layer, a relationship between threshold voltage Vth and thickness d of the barrier layer is expressed by (formula 1) and (formula 2), wherein $\varepsilon s$ represents a permittivity of AlGaN, d represents a thickness of the barrier layer right under a gate electrode, $\phi_{Bn}$ represents a potential barrier height between the gate electrode and the barrier layer, $\Delta Ec$ represents a discontinuity amount of a conduction band at an interface between AlGaN and GaN, $N_D$ represents a carrier concentration ($N_D(x)$ means a carrier concentration at position x), and q represents an elementary charge.

$$Vp = \frac{q}{\varepsilon s} \int_0^d N_D(x) x \, dx = \frac{q N_D d^2}{2\varepsilon s} \quad \text{[Formula 1]}$$

$$Vth = \phi_{Bn} - \frac{\Delta Ec}{q} - Vp \quad \text{[Formula 2]}$$

As can be seen from Formula 1 and Formula 2, threshold voltage Vth varies in proportion to the square of thickness d of the barrier layer right under the gate electrode. Furthermore, threshold voltage Vth is at a rising position of the gm-Vgs characteristic curve, so that a variation in threshold voltage Vth corresponds to a variation in lateral position in the gm-Vgs characteristic curve with respect to a Vgs axis. Here, thickness d of the barrier layer is a thickness of the barrier layer remaining after the gate recess has been formed, so that when the gate recess depth fluctuates, the lateral position in the gm-Vgs characteristic curve with respect to the Vgs axis also fluctuates.

As described above, as for the gm-Vgs characteristic curve of the combined transistors provided by combining a plurality of transistors having different gate recess depths, the gm-Vgs characteristic curve cannot be combined as designed, due to the variation in the depth of the manufactured gate recess, so that the aimed flatness cannot be provided, and high linearity cannot be provided in the field effect transistor.

Furthermore, if the gate recess depth is to be formed in multiple levels, control in etching depth directions becomes more complicated, so that a yield is problematically lowered.

That is to say, in the semiconductor device having the conventional gate recess structure, it is difficult to obtain a flat gm-Vgs curve.

Meanwhile, as shown in Formula 3, gm also depends on impedance component Rs along a channel between the gate and the source. Thus, an object of the present disclosure is to readily provide a field effect transistor having excellent linearity with a flat gm-Vgs curve obtained by varying Rs without varying a gate recess depth and Vth.

$$gm = \frac{gm0}{1 + gm0 Rs} \quad \text{[Formula 3]}$$

In Formula 3, Rs represents source resistance, gm0 represents intrinsic mutual conductance, and gm represents mutual conductance.

Hereinafter, exemplary embodiments of the present disclosure will be described with reference to the drawings.

First Exemplary Embodiment

Figure 2:
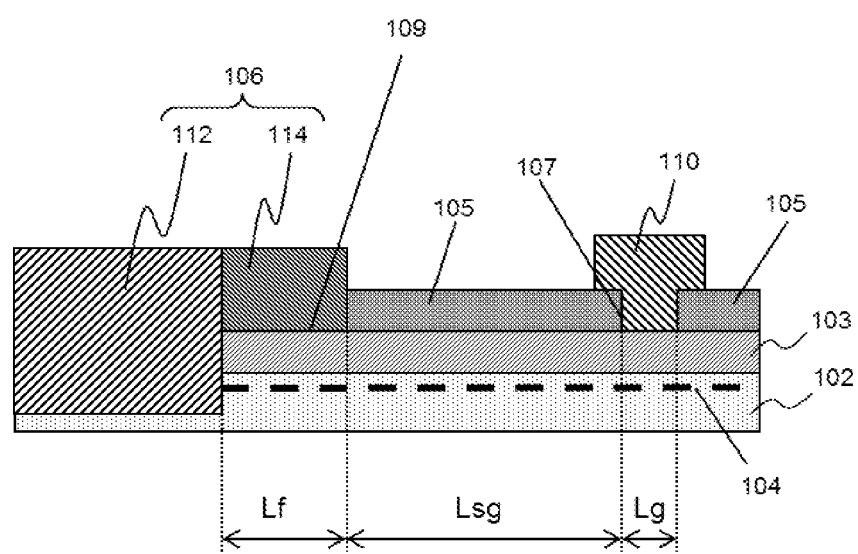
FIG. 2 is an enlarged cross-sectional view of a source-gate portion of the semiconductor device in the first exemplary embodiment.

FIG. 1 is a cross-sectional view of a semiconductor device in the first exemplary embodiment in the present disclosure, and FIG. 2 is an enlarged cross-sectional view of a vicinity of a source electrode portion in the semiconductor device.

As shown in FIG. 1, the semiconductor device in the present disclosure includes substrate 101 made of Si, first nitride semiconductor layer 102 that is formed on substrate 101, made of undoped GaN (hereinafter, referred to as i-GaN) and has a thickness of 1 μm, and second nitride semiconductor layer 103 that is formed on first nitride semiconductor layer 102, made of undoped AlGaN (hereinafter, referred to as i-AlGaN) and has a thickness of 30 nm. Furthermore, two-dimensional electron gas (2 DEG) layer 104 is formed in first nitride semiconductor layer 102 in a vicinity of an interface between first nitride semiconductor layer 102 and second nitride semiconductor layer 103. Furthermore, passivation film 105 made of SiN and having a thickness of 100 nm is formed on second nitride semiconductor layer 103. Furthermore, opening 107 is formed in passivation film 105, and gate electrode 110 is formed at a position of opening 107. Furthermore, two recesses are formed in each of first nitride semiconductor layer 102 and second nitride semiconductor layer 103, and source electrode portion 106 and drain electrode 108 are formed in the recesses, respectively. Furthermore, passivation film 105 is removed in a vicinity of source electrode portion 106, and region 109 is formed therein. Source electrode portion 106 has recess electrode 112 which is directly in contact with two-dimensional electron gas layer 104, and surface electrode 114. Surface electrode 114 is disposed between gate electrode 110 and recess electrode 112, formed on region 109, and has a contact with second nitride semiconductor layer 103. The semiconductor device shown in FIG. 1 is a metal-semiconductor FET (MESFET).

Furthermore, the electrode in source electrode portion 106 has a multilayer structure of metals Ti and Al (such as stacked layers of Ti/Al/Ti in which Ti is in contact with second nitride semiconductor layer 103). The electrode in drain electrode 108 has a multilayer structure of metals Ti and Au (such as stacked layers of Ti/Au/Ti in which Ti is in contact with second nitride semiconductor layer 103). Furthermore, the electrode in gate electrode 110 has a multilayer structure of metals Ni and Au (such as stacked layers of Ni/Au in which Ni is in contact with second nitride semiconductor layer 103).

Furthermore, as for gate electrode 110, gate length Lg (width of gate electrode 110 which is in contact with second nitride semiconductor layer 103) is 0.7 μm, and portions (eaves) which are in contact with an upper surface of passivation film 105 are provided on both sides of opening 107, and their widths (widths of the eaves) are each 0.35 μm.

Furthermore, distance Lsg between a gate-side end of source electrode portion 106 (a gate-side end of surface electrode 114) and a source-side end of gate electrode 110 is 1.7 μm. Here, the "gate-side end of source electrode portion 106" means one end of source electrode portion 106 which is closer to gate electrode 110, of two ends thereof which are in contact with second nitride semiconductor layer 103, and the "source-side end of gate electrode 110" means one end of gate electrode 110 which is closer to source electrode portion 106, of two ends thereof which are in contact with second nitride semiconductor layer 103. Furthermore, distance Lgd between a drain-side end of gate electrode 110 and a gate-side end of drain electrode 108 is 5 μm. Here, the "gate-side end of drain electrode 108" means one end of drain electrode 108 which is closer to gate electrode 110, of two ends thereof which are in contact with second nitride semiconductor layer 103, and the "drain-side end of gate electrode 110" means one end of gate electrode 110 which is closer to drain electrode 108, of the two ends thereof which are in contact with second nitride semiconductor layer 103.

The semiconductor device in FIG. 1 was subjected to an examination as follows. That is to say, with width Lf of surface electrode 114 in a gate-source direction (a direction parallel to a direction from gate electrode 110 to source electrode portion 106) used as a parameter, while a source potential was applied to surface electrode 114 and recess electrode 112, a variation in drain-source current Ids due to a variation in gate-source voltage Vgs was measured.

Both cases in which opening 107 is provided and not provided were examined. Table 1 shows examined samples A to E.

TABLE 1

| Sample name | Distance Lf between electrodes near surface (μm) | Gate-source distance Lsg (μm) | Gate recess | Lf/Lsg |
|---|---|---|---|---|
| Sample A | 0.45 | 1.7 | Not formed | 0.3 |
| Sample B | 0.75 | 1.7 | Not formed | 0.4 |
| Sample C | 0.75 | 1.7 | Formed | 0.4 |
| Sample D | 0.95 | 1.7 | Not formed | 0.6 |
| Sample E | 1.8 | 1.7 | Formed | 1.1 |

A result of the measurement of the variation in drain-source current Ids due to the variation in gate-source voltage Vgs will be described below.

Figure 3A:
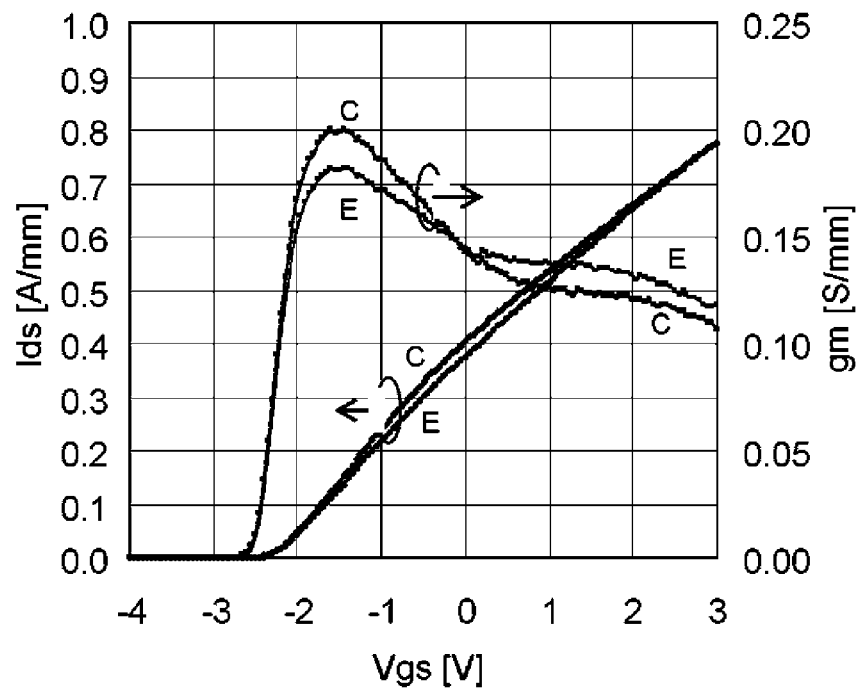
FIG. 3A is a graph showing a gm-Vgs characteristic curve in the semiconductor device in the first exemplary embodiment.
Figure 3B:
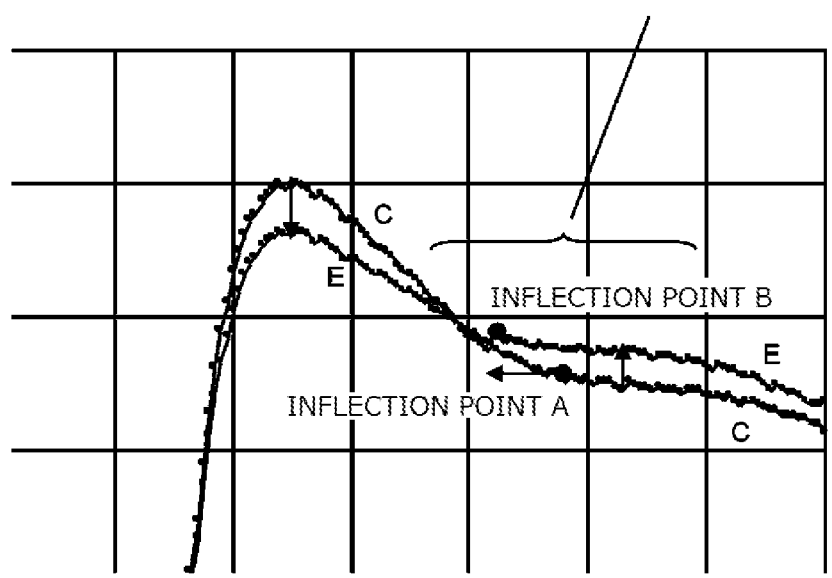
FIG. 3B is an enlarged view in a vicinity of an inflection point in the gm-Vgs characteristic curve in FIG. 3A.

First, as for samples having opening 107 (sample C and sample E), FIGS. 3A and 3B each show graphs of gm-Vgs characteristic curves and Ids-Vgs characteristic curves when Lf is 0.75 μm (sample C) and Lf is 1.8 μm (sample E). FIG. 3B is an enlarged view in a vicinity of a peak position of the gm-Vgs curve in FIG. 3A.

Referring to FIG. 3A, turn-on voltage Vth is −2.5 V, which is the same in sample C and sample E. Thus, it is found that Vth does not depend on Lf.

Referring to FIG. 3B, inflection point A is provided around Vgs=0 V when Lf=0.75 μm (graph C). Furthermore, inflection point B is provided when Lf=1.8 μm (graph E).

In general, when a current flows from two-dimensional electron gas layer 104 only through recess electrode 112, gm shows a maximum value $gm_{max}$ at a certain Vgs, but when Vgs is higher, gm is abruptly lowered, and an inflection point does not appear.

According to the present disclosure, inflection point A and inflection point B appear in FIG. 3B, which is considered due to a fact that a current flows from two-dimensional electron gas layer 104 to surface electrode 114 through second nitride semiconductor layer 103, and this current is considered due to a tunnel effect. That is to say, mutual conductance due to this current contributes to gm of the transistor, so that inflection point A and inflection point B are generated.

Furthermore, referring to FIG. 3B, inflection point B is closer to the peak position of gm ($gm_{max}$ in the gm-Vgs curve) than inflection point A, which is considered due to a fact that Lf in generating inflection point B is longer than Lf in generating inflection point A. That is to say, as width Lf of surface electrode 114 is longer in the gate-source direction, the current flowing from two-dimensional electron gas layer 104 increases, so that the mutual conductance due to the large current becomes high, which more contributes to gm.

Furthermore, as Lf is increased, a distance between gate electrode 110 and recess electrode 112 is increased, and gate-source resistance Rs is increased. The gm characteristics of the transistor are expressed by Formula 3 in general, so that as the Lf value is increased, the gm value is decreased. As a result, the $gm_{max}$ is decreased.

As described above, in the field effect transistor in the present disclosure, by increasing Lf, a flat region can be generated in the gm-Vgs curve without fluctuating Vth. Furthermore, it can be seen from FIG. 3B that as Lf is increased, a larger flat region can be generated in the gm-Vgs curve.

Figure 4:
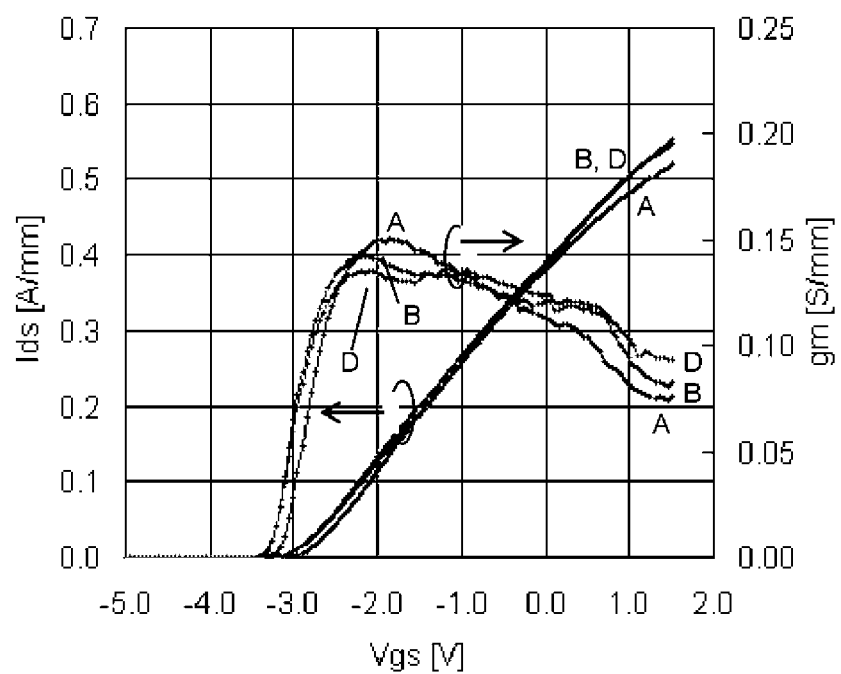
FIG. 4 is a graph showing a gm-Vgs characteristic curve in the semiconductor device in the first exemplary embodiment.

Next, as for samples not having a gate recess (sample A, sample B, and sample D), FIG. 4 shows graphs of gm-Vgs characteristic curves and Ids-Vgs characteristic curves when Lf is 0.45 μm (sample A), 0.75 μm (sample B), and 0.95 μm (sample D).

First, referring to FIG. 4, as for the Ids-Vgs curve, there is no large difference among sample A, sample B, and sample D.

As shown in FIG. 4, as for the gm-Vgs curve in sample A, there is no inflection point which has been described with reference to FIGS. 3A and 3B, and as Vgs is increased, gm is monotonically decreased, and there is no flat region in the gm-Vgs curve. Meanwhile, as for each of the gm-Vgs curves in sample B and sample D, the inflection points appear which has been described with reference to FIGS. 3A and 3B, and there is a region (flat region) in which gm is almost constant.

The reason of this result will be described below.

As for sample A, an area of surface electrode 114 is small, so that a small current flows from two-dimensional electron gas layer 104 to surface electrode 114 through second nitride semiconductor layer 103. Therefore, it is considered that mutual conductance due to the current flowing from two-dimensional electron gas layer 104 to surface electrode 114 does not contribute to gm so much, so that the inflection point does not appear.

Meanwhile, as for samples B and D, it is considered that a large current flows from two-dimensional electron gas layer 104 to surface electrode 114, so that mutual conductance due to that current contributes to gm, and the inflection point appears.

Based on the above result, Table 2 shows a relationship between Lf and Lsg in the present disclosure. Lsg is the distance between the gate-side end of surface electrode 114 and the source-side end of gate electrode 110 as shown in FIG. 2.

TABLE 2

| Sample name | Lf/Lsg | Flat region |
|---|---|---|
| Sample A | 0.3 | Not generated |
| Sample B | 0.4 | Generated |
| Sample C | 0.4 | Generated |
| Sample D | 0.6 | Generated |
| Sample E | 1.1 | Generated |

According to the present disclosure, when the field effect transistor is designed such that Lf is 0.4 times or more Lsg, the flat region can be provided in the gm-Vgs curve. When a voltage near Vgs corresponding to the gm maximum value is chosen as an operating point, a high-frequency power amplifier having excellent linearity and capable of a high-output operation can be manufactured.

Furthermore, even when surface electrode 114 and recess electrode 112 are away from each other, the flat region can be provided in the gm-Vgs curve, so that a design is to be appropriately made in view of high-output requirements and a linear region.

As described above, when the source potential is applied to surface electrode 114 and recess electrode 112, and the width of surface electrode 114 in the gate-source direction is set to be 0.4 times or more distance Lsg between the gate-side end of surface electrode 114 and the source-side end of gate electrode 110, the gm-Vgs characteristic curve can be made flat.

Thus, according to the present disclosure, the gm-Vgs curve has the flat region, so that when the voltage near Vgs corresponding to $gm_{max}$ is chosen as the operating point, the semiconductor device having excellent linearity and capable of a high-output operation can be manufactured.

Second Exemplary Embodiment

In this exemplary embodiment, points different from the first exemplary embodiment will be mainly described. The same configuration as that of the semiconductor device in the first exemplary embodiment is not described.

Figure 5:
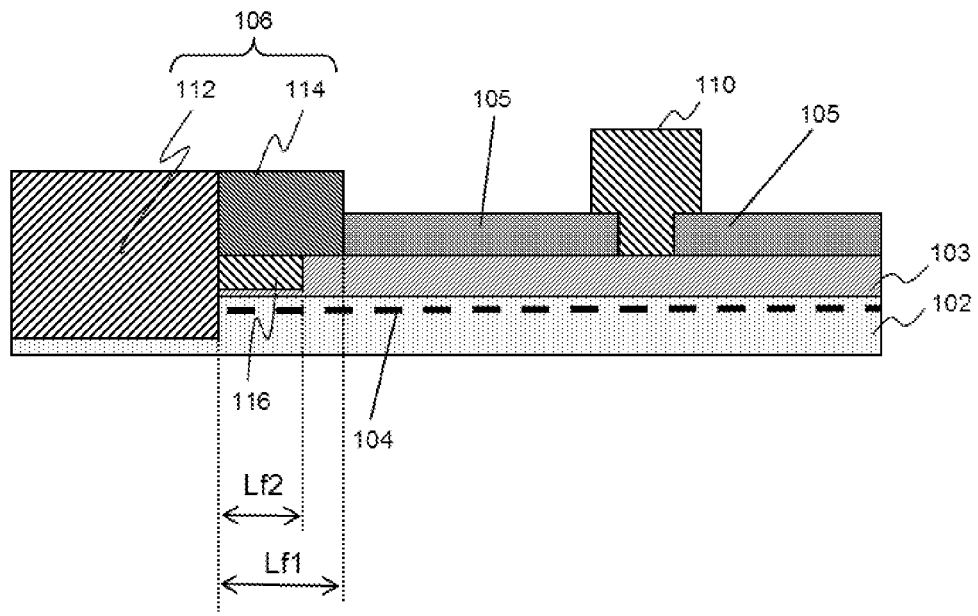
FIG. 5 is an enlarged cross-sectional view of a source-gate portion of a semiconductor device in a second exemplary embodiment.

FIG. 5 is an enlarged cross-sectional view of a semiconductor device in the second exemplary embodiment in the present disclosure. FIG. 5 shows a portion between a source and a gate in the semiconductor device. In addition, a portion between the gate and a drain is the same as in FIG. 1, so that it is not shown. This semiconductor device is an FET.

This semiconductor device differs from the semiconductor device in the first exemplary embodiment in that second recess electrode 116 is provided between first recess electrode 112 and a gate-side end of surface electrode 114, in source electrode portion 106. Furthermore, a depth of a recess in second nitride semiconductor layer 103 in which second recess electrode 116 is formed (the depth of the recess corresponds to a thickness of second recess electrode 116) is smaller than a thickness of second nitride semiconductor layer 103. That is, a bottom surface position of second recess electrode 116 is above a bottom surface position of second nitride semiconductor layer 103.

Here, Lf1 represents a width of surface electrode 114 in a gate-source direction, and Lf2 represents a width of second recess electrode 116 in the gate-source direction. Lf1 corresponds to Lf in FIG. 2. Hereinafter, focusing on Lf2, an inflection point in a gm-Vgs curve will be described.

In the semiconductor device shown in FIG. 5, since second nitride semiconductor layer 103 is thin in a region having Lf2, a small resistance is provided between second recess electrode 116 and two-dimensional electron gas layer 104. Therefore, compared with the semiconductor device shown in FIG. 2, a large current flows from two-dimensional electron gas layer 104 to surface electrode 114 through second nitride semiconductor layer 103 and second recess electrode 116. The large current contributes to mutual conductance gm more than the semiconductor device in FIG. 2. Therefore, due to the region having Lf2 in the semiconductor device shown in FIG. 5, the inflection point comes closer to a peak position of gm than the semiconductor device shown in FIG. 2. Thus, a flat region is larger in the gm-Vgs curve, so that when a voltage near Vgs corresponding to a gm maximum value is chosen as an operating point, a semiconductor device having excellent linearity and capable of a high-output operation can be manufactured.

In addition, the thickness and width Lf2 of second recess electrode 116, and width Lf1 of surface electrode 114 are to be appropriately designed after due consideration to an output operation condition, and a linear region to be used.

Third Exemplary Embodiment

In this exemplary embodiment, points different from the first exemplary embodiment will be mainly described. The same configuration as that of the semiconductor device in the first exemplary embodiment is not described.

Figure 6:
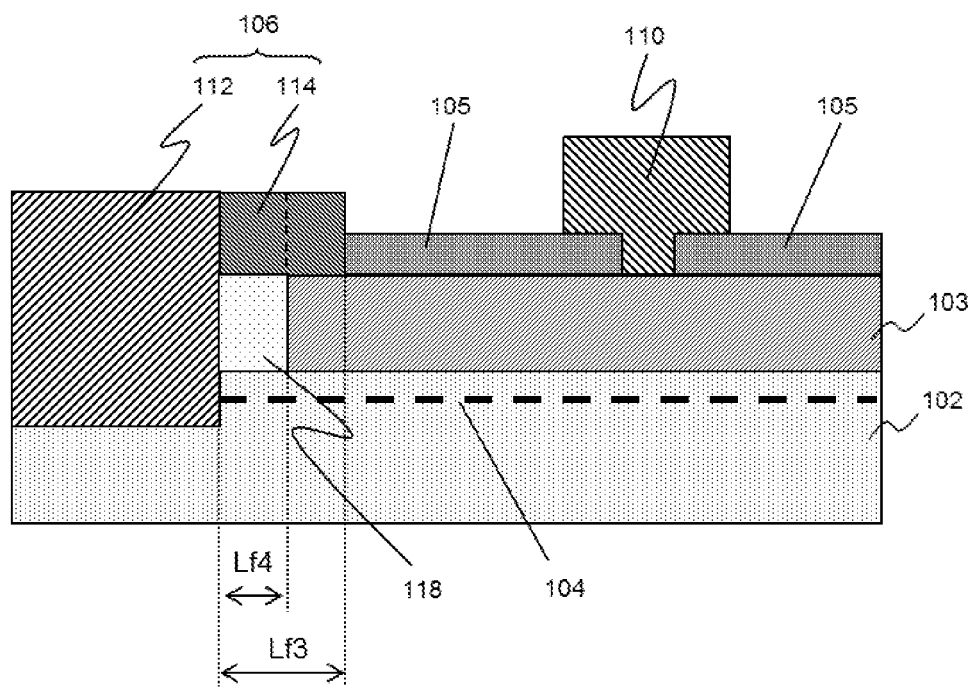
FIG. 6 is an enlarged cross-sectional view of a source-gate portion of a semiconductor device in a third exemplary embodiment.

FIG. 6 is an enlarged cross-sectional view of a semiconductor device in the third exemplary embodiment in the present disclosure. FIG. 6 shows a portion between a source and a gate in the semiconductor device. In addition, a portion between the gate and a drain is the same as in FIG. 1, so that it is not shown. This semiconductor device is an FET.

At least a part of second nitride semiconductor layer 103 under surface electrode 114 is formed of third nitride semiconductor layer 118 having a wider bandgap than second nitride semiconductor layer 103.

Here, Lf3 represents a width of surface electrode 114 which is in contact with second nitride semiconductor layer 103 and third nitride semiconductor layer 118, in a gate-source direction, and Lf4 represents a width of surface electrode 114 which is in contact with third nitride semiconductor layer 118, in the gate-source direction. Lf3 corresponds to Lf in FIG. 2.

In this case, focusing on Lf4, a lateral position of inflection point A will be described. In a region having Lf4 in this configuration, the bandgap of third nitride semiconductor layer 118 is wider than that of second nitride semiconductor layer 103, so that ΔEc is great, and a carrier concentration of two-dimensional electron gas layer 104 is high. As a result, gate-source resistance Rs can be reduced. That is to say, the gm value is increased from the relationship in Formula 3. As described above, a region on a right side of inflection point A in a gm-Vgs curve of the semiconductor device shown in FIG. 6 is increased compared with the semiconductor device shown in FIG. 2. As a result, a flat region can be increased in a gm-Vgs curve, so that when a voltage near Vgs corresponding to a gm maximum value is chosen as an operating point, a high-frequency power amplifier having excellent linearity and capable of a high-output operation can be manufactured. Here, a composition ratio of third nitride semiconductor layer 118, and a combination of Lf3 and Lf4 are to be appropriately designed after due consideration to an output operation condition and a linear region to be used.

Fourth Exemplary Embodiment

In this exemplary embodiment, points different from the first exemplary embodiment will be mainly described. The same configuration as that of the semiconductor device in the first exemplary embodiment is not described.

Figure 7:
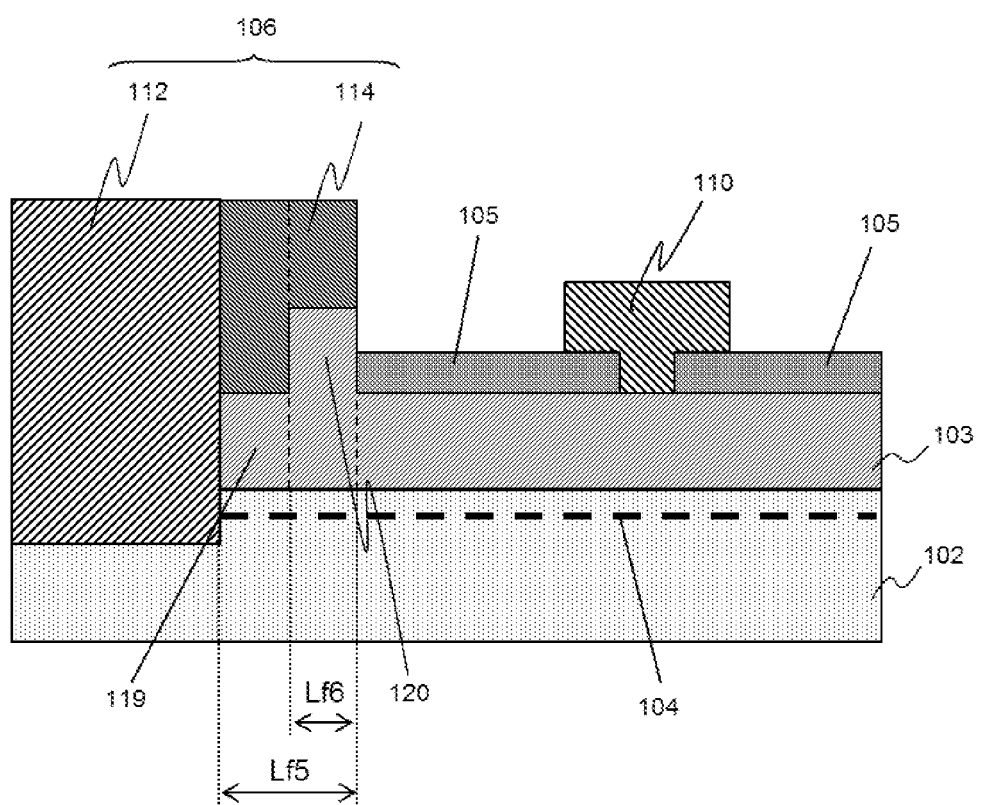
FIG. 7 is an enlarged cross-sectional view of a source-gate portion of a semiconductor device in a fourth exemplary embodiment.

FIG. 7 is an enlarged cross-sectional view of a semiconductor device in the fourth exemplary embodiment in the present disclosure. FIG. 7 shows a portion between a source and a gate in the semiconductor device. A portion between the gate and a drain is the same as in FIG. 1, so that it is not shown. This semiconductor device is an FET.

Second nitride semiconductor layer 103 under surface electrode 114 includes first portion 119 having a first thickness, and second portion 120 having a second thickness larger than the first thickness toward a surface of substrate 101.

Here, Lf5 represents a width of surface electrode 114 in a gate-source direction, and Lf6 represents a width of second portion 120 in the gate-source direction. Lf5 corresponds to Lf in FIG. 2. In this case, focusing on Lf6, a lateral position of inflection point A will be described. In this configuration, in a region having Lf6, second nitride semiconductor layer 103 is thicker than that in a region having Lf5, so that polarization due to a piezo effect is great, and a carrier concentration of two-dimensional electron gas layer 104 is high, so that gate-source resistance Rs can be reduced. That is, the gm value is increased from the relationship in Formula 3. As described above, a region on a right side of inflection point A in a gm-Vgs curve of the semiconductor device shown in FIG. 7 is increased compared with the semiconductor device shown in FIG. 2. As a result, a flat region can be increased in a gm-Vgs curve, so that when a voltage near Vgs corresponding to a gm maximum value is chosen as an operating point, a semiconductor device having excellent linearity and capable of a high-output operation can be manufactured.

Here, the thickness of second portion 120 and a combination of Lf5 and Lf6 are to be appropriately designed after due consideration to an output operation condition and a linear region to be used. Furthermore, second portion 120 may be formed in any position as long as it is positioned under surface electrode 114 and between gate electrode 110 and recess electrode 112.

Fifth Exemplary Embodiment

In this exemplary embodiment, points different from the first exemplary embodiment will be mainly described. The same configuration as that of the semiconductor device in the first exemplary embodiment is not described.

Figure 8A:
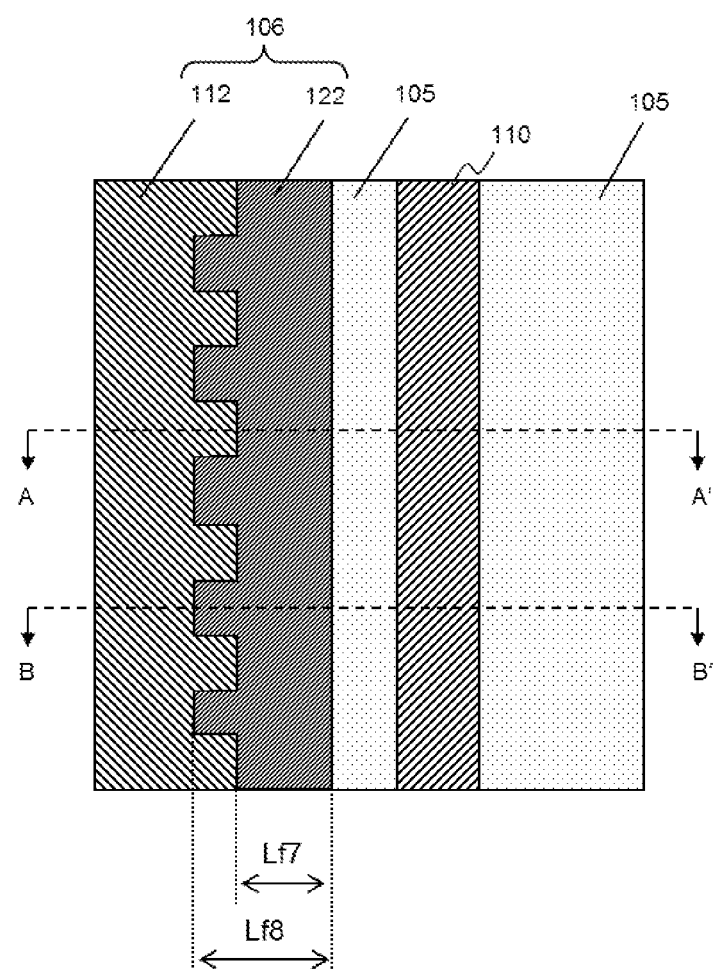
FIG. 8A is an enlarged top view of a source-gate portion of a semiconductor device in a fifth exemplary embodiment.
Figure 8B:
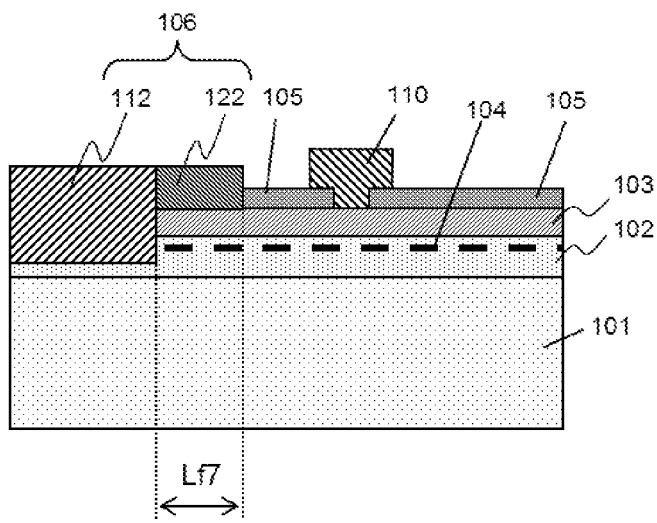
FIG. 8B is a cross-sectional view taken along A-A' in FIG. 8A.
Figure 8C:
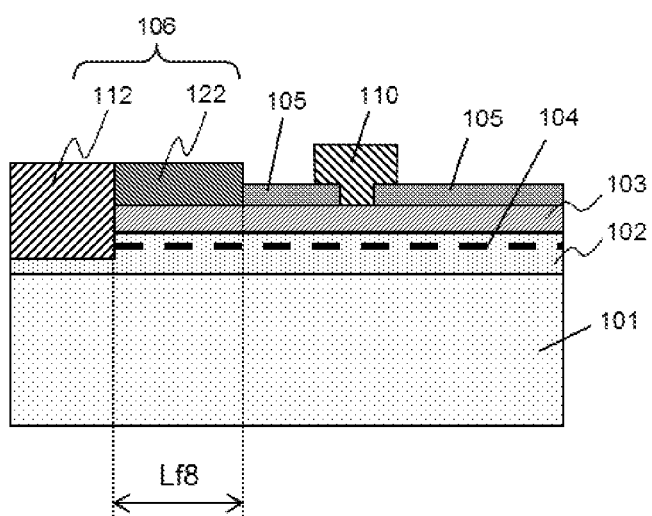
FIG. 8C is a cross-sectional view taken along B-B' in FIG. 8A.

FIGS. 8A to 8C are an enlarged top view and cross-sectional views of a semiconductor device in the fifth exemplary embodiment in the present disclosure. FIGS. 8A to 8C each show a portion between a source and a gate in the semiconductor device. A portion between the gate and a drain is the same as in FIG. 1, so that it is not shown. FIG. 8A is the enlarged top view of the semiconductor device, FIG. 8B is the cross-sectional view taken along line A-A' in FIG. 8A, and FIG. 8C is the cross-sectional view taken along line B-B' in FIG. 8A. This semiconductor device is an FET.

In this semiconductor device, a plurality of transistors each having a different width of surface electrode 122 in source electrode portion 106 in a gate-source direction are connected in parallel.

A width of surface electrode 122 of the transistor in a position along line A-A' is smaller than a width of surface electrode 122 of the transistor in a position along line B-B'.

Here, Lf7 represents the width of surface electrode 122 of the transistor in the position along line A-A', and Lf8 represents the width of surface electrode 122 of the transistor in the position along line B-B'. It is to be noted that Lf8 corresponds to Lf in FIG. 2, and Lf8>Lf7. Here, a position of an inflection point in a gm-Vgs curve will be described. As described in the first exemplary embodiment, as Lf is increased, the inflection point comes closer to the gm peak position, so that the inflection point of the transistor having surface electrode 122 with width Lf8 comes closer to a gm peak position than that of the transistor having surface electrode 122 with width Lf7. Since the surface electrodes having widths Lf7 and Lf8 are repeatedly formed in a planar direction of the semiconductor device, the inflection points closer to and farther from the gm peak position can be provided in the same gm-Vgs curve, so that the gm-Vgs curve can be further flattened. Therefore, when a voltage near Vgs corresponding to a gm maximum value is chosen as an operating point, a semiconductor device having excellent linearity and capable of a high-output operation can be manufactured.

Here, width Lf7 and width Lf8 of surface electrode 122 are to be appropriately designed after due consideration to an output operation condition and a linear region to be used.

The above exemplary embodiments may be appropriately combined. Furthermore, the description given in the above exemplary embodiment is only one example to embody the present disclosure, and the present disclosure is not limited to the above examples, and can be applied to various examples which can be readily configured by a person in the art with the technique of the present disclosure.

The semiconductor device in the present disclosure can be applied to a high-frequency amplifier having excellent linearity and capable of a high-output operation, and the semiconductor device is industrially very useful.

What is claimed is:
1. A semiconductor device comprising:
a substrate;
a semiconductor stacked body including a first nitride semiconductor layer formed on the substrate, and a second nitride semiconductor layer formed on the first nitride semiconductor layer and having a wider bandgap than the first nitride semiconductor layer;

a source electrode portion and a drain electrode formed at an interval from each other and above a lower surface of the semiconductor stacked body; and a gate electrode formed between the source electrode portion and the drain electrode at an interval from the source electrode portion and the drain electrode, wherein the source electrode portion includes:

a first recess electrode formed so as to be directly in contact with a two-dimensional electron gas layer formed in the first nitride semiconductor layer, and a surface electrode formed between the gate electrode and the first recess electrode so as to be directly in contact with an upper surface of the second nitride semiconductor layer, and formed so as to be connected conductively to the two-dimensional electron gas layer through the second nitride semiconductor layer, the surface electrode and the first recess electrode have potentials substantially equal to a source potential, and a width of the surface electrode in a gate-source direction is 0.4 times or more a distance between a gate-side end of the surface electrode and a source-side end of the gate electrode.

2. The semiconductor device according to claim 1, wherein the width of the surface electrode in the gate-source direction is 1.1 times or less the distance between the gate-side end of the surface electrode and the source-side end of the gate electrode.

3. The semiconductor device according to claim 1, wherein the source electrode portion further includes a second recess electrode formed between the first recess electrode and the gate-side end of the surface electrode, and a bottom surface position of the second recess electrode is above a bottom surface position of the second nitride semiconductor layer.

4. The semiconductor device according to claim 1, wherein at least a part of the second nitride semiconductor layer provided under the surface electrode is formed of a third nitride semiconductor layer having a wider bandgap than the second nitride semiconductor layer.

5. The semiconductor device according to claim 1, wherein the second nitride semiconductor layer provided under the surface electrode includes a first portion having a first thickness, and a second portion having a second thickness larger than the first thickness.

6. The semiconductor device according to claim 1, wherein a plurality of semiconductor devices each having a different width of the surface electrode in the gate-source direction are connected in parallel.

7. The semiconductor device according to claim 2, wherein the source electrode portion further includes a second recess electrode formed between the first recess electrode and the gate-side end of the surface electrode, and a bottom surface position of the second recess electrode is above a bottom surface position of the second nitride semiconductor layer.

8. The semiconductor device according to claim 2, wherein at least a part of the second nitride semiconductor layer provided under the surface electrode is formed of a third nitride semiconductor layer having a wider bandgap than the second nitride semiconductor layer.

9. The semiconductor device according to claim 2, wherein the second nitride semiconductor layer provided under the surface electrode includes a first portion having a first thickness, and a second portion having a second thickness larger than the first thickness.

10. The semiconductor device according to claim 2, wherein a plurality of semiconductor devices each having a different width of the surface electrode in the gate-source direction are connected in parallel.

* * * * *